United States Patent
Otsubo

(10) Patent No.: US 11,309,985 B2
(45) Date of Patent: Apr. 19, 2022

(54) LIGHT SOURCE DEVICE THAT INCLUDES A PLURALITY OF LIGHT SOURCES WITH DIFFERENT WAVELENGTHS AND METHOD OF CONTROLLING WAVELENGTHS

(71) Applicant: Fujitsu Optical Components Limited, Kawasaki (JP)

(72) Inventor: Koji Otsubo, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 17/136,177

(22) Filed: Dec. 29, 2020

(65) Prior Publication Data

US 2021/0273737 A1    Sep. 2, 2021

(30) Foreign Application Priority Data

Mar. 2, 2020   (JP) .............................. JP2020-034605

(51) Int. Cl.
| | |
|---|---|
| *H04J 14/02* | (2006.01) |
| *H01L 35/28* | (2006.01) |
| *H05B 47/155* | (2020.01) |
| *H01S 5/024* | (2006.01) |

(52) U.S. Cl.
CPC .............. *H04J 14/02* (2013.01); *H01L 35/28* (2013.01); *H01S 5/02415* (2013.01); *H05B 47/155* (2020.01)

(58) Field of Classification Search
None
See application file for complete search history.

(56) References Cited

U.S. PATENT DOCUMENTS

| | | | |
|---|---|---|---|
| 5,515,682 A | 5/1996 | Nagakubo et al. | |
| 5,696,859 A * | 12/1997 | Onaka ................ | G02B 6/12007 372/20 |
| 5,966,938 A | 10/1999 | Nagakubo et al. | |
| 6,318,906 B1 | 11/2001 | Ishizaka | |
| 7,359,648 B2 * | 4/2008 | Rubin ................... | H01S 5/0687 398/182 |
| 2011/0158643 A1 * | 6/2011 | Yamazaki ............ | H04B 10/572 398/38 |

FOREIGN PATENT DOCUMENTS

| | | |
|---|---|---|
| JP | 7-288351 | 10/1995 |
| JP | 2000-91695 | 3/2000 |

* cited by examiner

*Primary Examiner* — David W Lambert
(74) *Attorney, Agent, or Firm* — Staas & Halsey LLP

(57) ABSTRACT

A light source device includes: a plurality of light sources that generate rays of light with different wavelengths corresponding to a plurality of target wavelengths located on a designated wavelength grid; a plurality of photodetectors that detect output powers of the plurality of light sources; a plurality of optical bandpass filters that are provided between the plurality of light sources and the plurality of photodetectors; a temperature adjustment unit that adjusts a temperature of an area around the plurality of light sources; and a processor that controls the temperature adjustment unit based on output signals of the plurality of photodetectors. Widths of passbands of the optical bandpass filters are less than a wavelength spacing in the wavelength grid.

10 Claims, 10 Drawing Sheets

Related Art

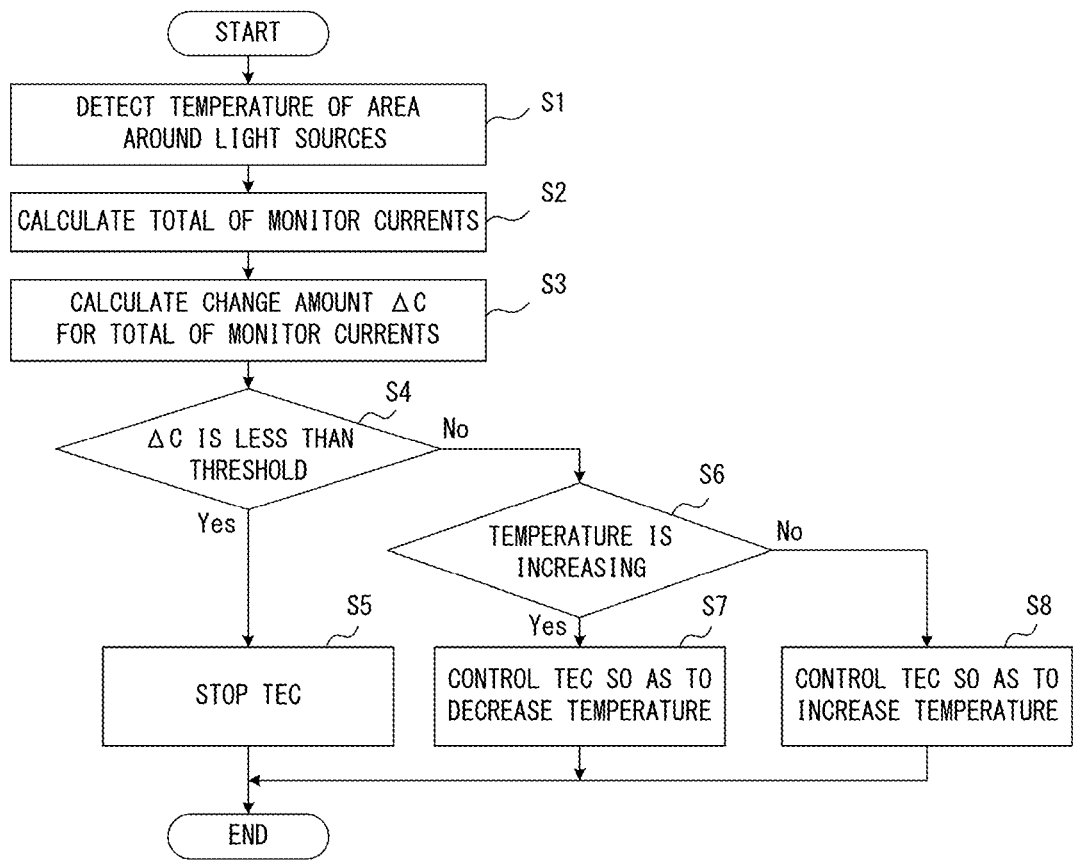
F I G. 6

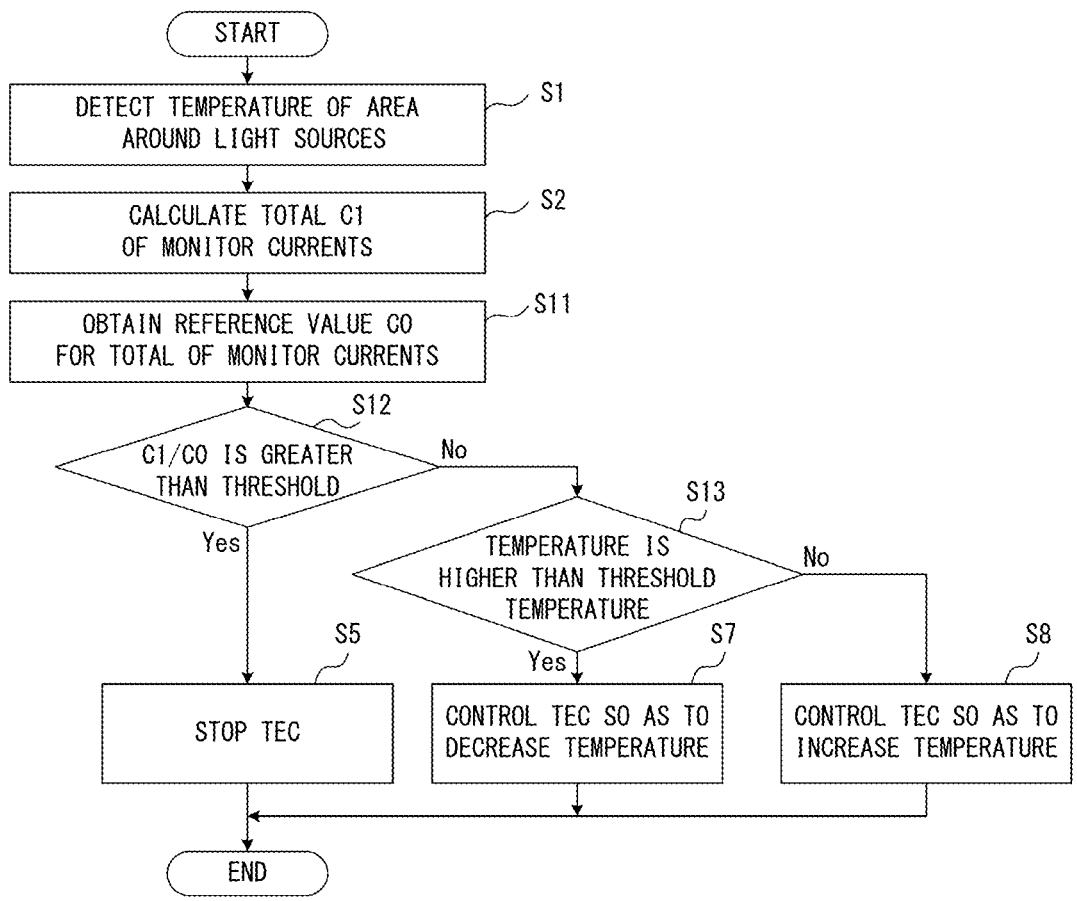
F I G. 7

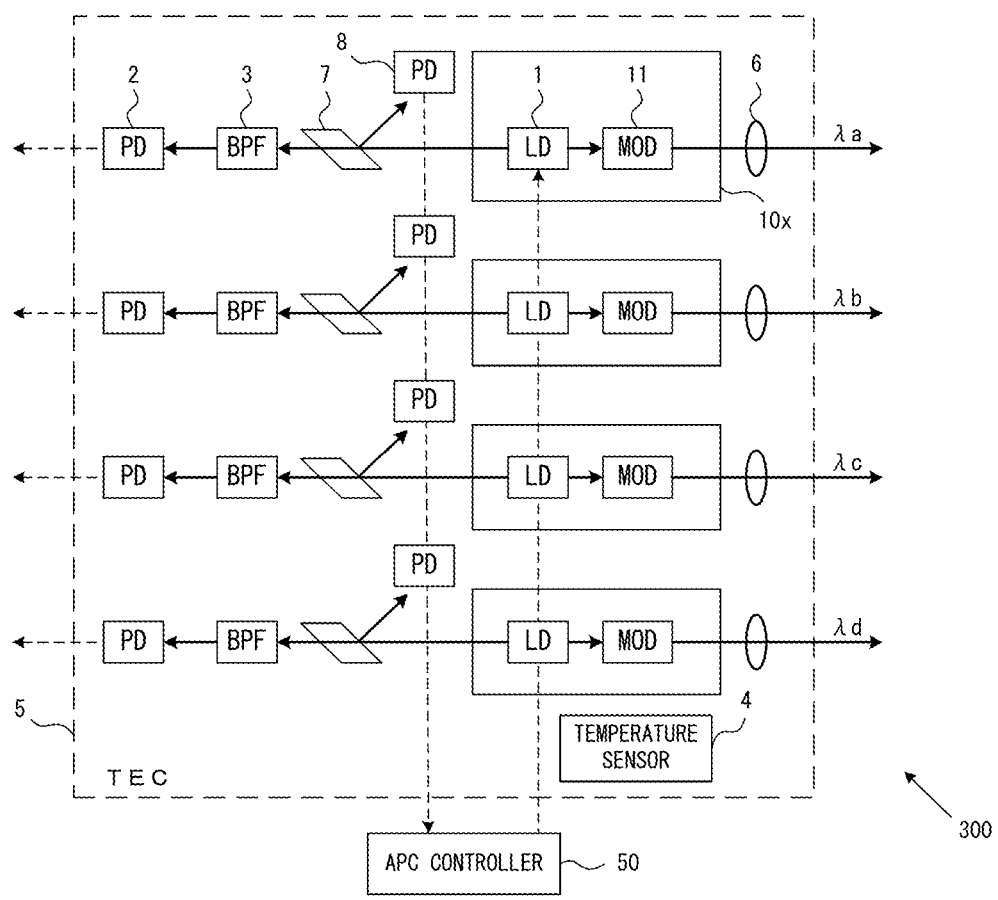
F I G. 10

US 11,309,985 B2

LIGHT SOURCE DEVICE THAT INCLUDES A PLURALITY OF LIGHT SOURCES WITH DIFFERENT WAVELENGTHS AND METHOD OF CONTROLLING WAVELENGTHS

CROSS-REFERENCE TO RELATED APPLICATION

This application is based upon and claims the benefit of priority of the prior Japanese Patent Application No. 2020-034605, filed on Mar. 2, 2020, the entire contents of which are incorporated herein by reference.

FIELD

The embodiments discussed herein are related to a light source device that includes a plurality of light sources with different wavelengths and a method of controlling each of the wavelengths of light generated by the light sources.

BACKGROUND

Wavelength division multiplexing (WDM) has been put into practical use so as to transmit large volumes of signals in an optical communication network. In WDM, a plurality of optical signals with different wavelengths are transmitted via one optical fiber. For example, four 25-Gpbs signals may be multiplexed using four wavelengths so as to implement a 100-Gbps WDM transmission.

Data communication standards pertaining to WDM define various wavelength grids. For example, in coarse WDM (CWDM), wavelength channels are configured at a spacing of 20 nm, and in LAN-WDM, wavelength channels are configured at a spacing of 5 nm.

FIGS. 1A and 1B illustrate an example of a multi-wavelength light source. As depicted in FIG. 1A, the multi-wavelength light source includes a plurality of light sources LD0-LD3. The light sources LD0-LD3 generate rays of light with wavelengths different from each other. An optical combiner combines rays of light output from the light sources LD0-LD3. The optical combiner includes optical filters F0-F3 having passbands corresponding to the light sources LD0-LD3.

The light sources LD0-LD3 and the optical filters F0-F3 are designed such that wavelengths $\lambda 0$-$\lambda 3$ are located on a specified wavelength grid, as depicted in FIG. 1B. For example, the light sources LD0-LD3 may be designed such that wavelengths $\lambda 0$-$\lambda 3$ respectively match grid wavelengths $\lambda g0$-$\lambda g3$. The optical filters F0-F3 may be designed such that the center wavelengths in the passbands of these filters match grid wavelengths $\lambda g0$-$\lambda g3$.

However, wavelengths $\lambda 0$-$\lambda 3$ vary according to the temperature of the light sources LD0-LD3. Thus, wavelengths $\lambda 0$-$\lambda 3$ will be shifted from the wavelength grid if the temperature of the light sources LD0-LD3 changes. Accordingly, the multi-wavelength light source may include a thermoelectric cooler (TEC) as depicted in FIG. 1A in order to realize accurate wavelength control. For example, the TEC may include a Peltier element. The TEC is controlled by a controller (not illustrated) such that wavelengths $\lambda 0$-$\lambda 3$ each fall within a specified wavelength range.

A Peltier element and a control circuit for the Peltier element are described in, for example, Japanese Laid-open Patent Publication No. 7-288351. An optical communication module that includes a Peltier element is described in, for example, Japanese Laid-open Patent Publication No. 2000-091695.

As described above, a light source device that includes a plurality of light sources and stabilizes temperature of the light sources using a TEC in order to realize accurate wavelength control is known. However, the power consumption of the TEC is large. Thus, in the prior art, the power consumption of a light source device for implementing accurate wavelength control could be large.

SUMMARY

According to an aspect of the embodiments, a light source device includes: a plurality of light sources that generate rays of light with different wavelengths corresponding to a plurality of target wavelengths located on a designated wavelength grid; a plurality of photodetectors that detect output powers of the plurality of light sources; a plurality of optical bandpass filters that are provided between the plurality of light sources and the plurality of photodetectors; a temperature adjustment unit that adjusts a temperature of an area around the plurality of light sources; and a processor that controls the temperature adjustment unit based on output signals of the plurality of photodetectors. Widths of passbands of the optical bandpass filters are less than a wavelength spacing in the wavelength grid.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a flowchart illustrating an example of wavelength control;

FIG. 7 is a flowchart illustrating another example of wavelength control;

FIG. 10 illustrates another variation of a light source device in accordance with embodiments of the invention.

DESCRIPTION OF EMBODIMENTS

Figure 1A:
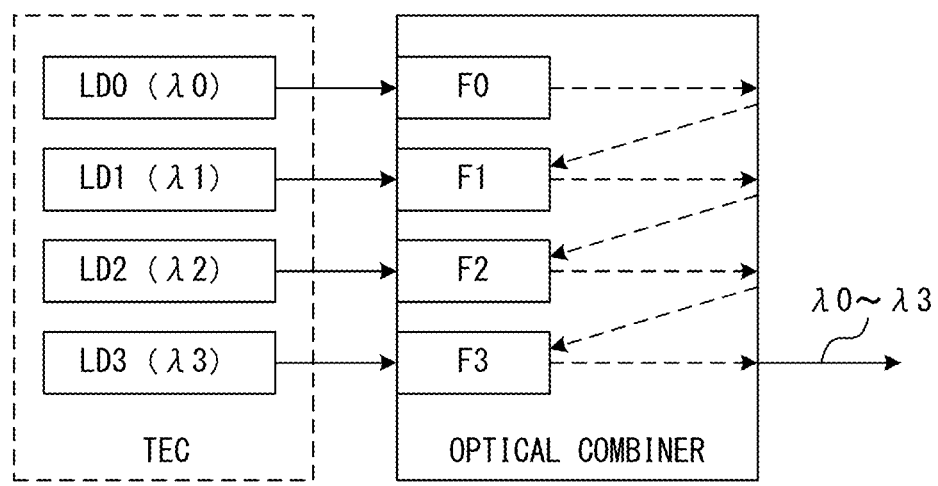
FIGS. 1A and 1B illustrate an example of a multi-wavelength light source.
Figure 1B:
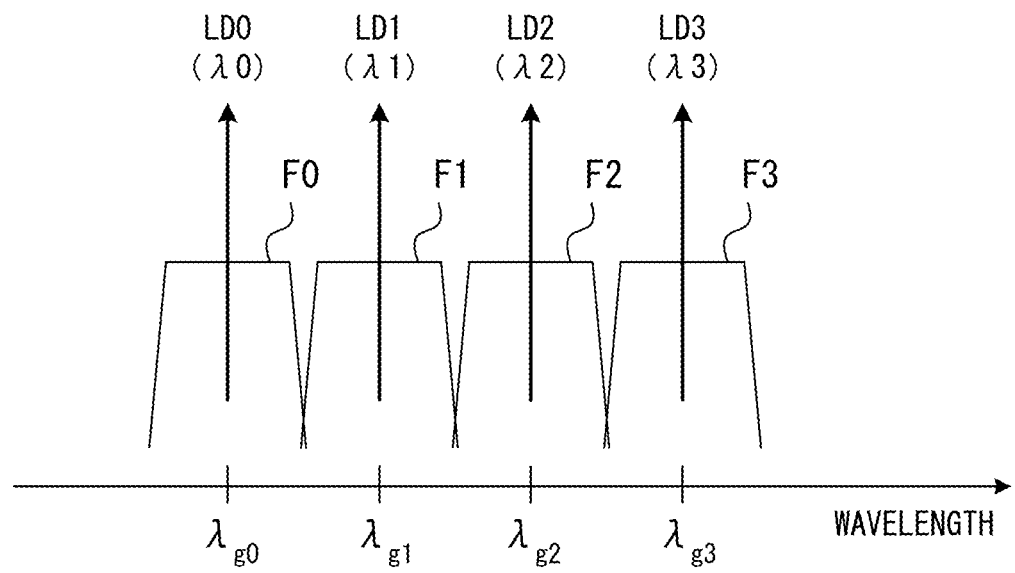
Figure 2:
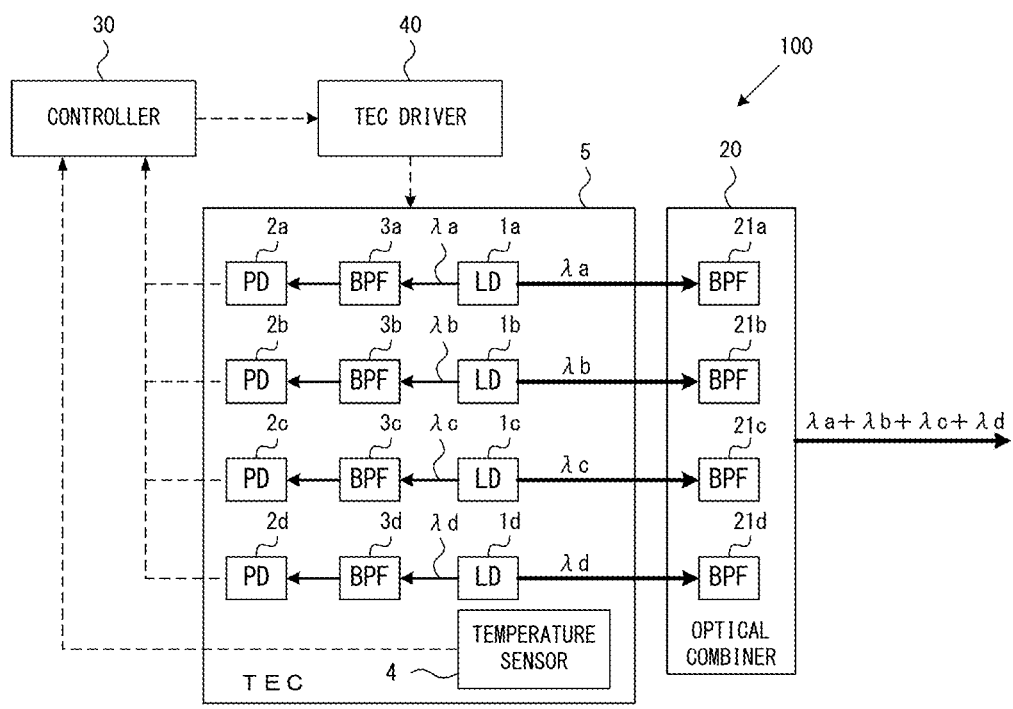
FIG. 2 illustrates an example of a light source device in accordance with embodiments of the invention.

FIG. 2 illustrates an example of a light source device in accordance with embodiments of the invention. A light source device 100 in accordance with embodiments of the invention includes a plurality of light sources (LDs) 1a-1d, a plurality of photodetectors (PDs) 2a-2d, a plurality of bandpass filters (BPFs) 3a-3d, a temperature sensor 4, a thermoelectric cooler (TEC) 5, an optical combiner 20, a controller 30, and a TEC driver 40. The light source device 100 may also include other elements that are not depicted in FIG. 2.

For example, each of the light sources 1a-1d may include a laser diode. The light sources 1a-1d respectively generate rays of light with wavelengths λa-λd. In this example, the light source device 100 is used in a WDM transmission system having a specified wavelength grid. In this case, wavelengths λa-λd are set to correspond to a plurality of consecutive target wavelengths in the wavelength grid. In the example depicted in FIG. 3, wavelengths λa-λd are set to respectively match target wavelengths λga-λgd.

Each of the light sources 1a-1d outputs light forward and rearward. The light output forward (i.e., main light) is guided to the optical combiner 20. The light output rearward (i.e., monitor light) is guided to corresponding photodetectors 2a-2d.

For example, each of the photodetectors 2a-2d may include a photodiode. The photodetectors 2a-2d each detect the power of monitor light output from a corresponding light source of the light sources 1a-1d. In this example, each of the photodetectors 2a-2d outputs a current signal indicating the power of corresponding monitor light. A signal output from each of the photodetectors 2a-2d may hereinafter be referred to as a "monitor current".

The BPFs 3a-3d are respectively provided between the light sources 1a-1d and the photodetectors 2a-2d. Thus, the photodetectors 2a-2d each detect the power of monitor light output from a corresponding light source of the light sources 1a-1d and passing through a corresponding BPF of the BPFs 3a-3d. The center wavelengths in the passbands of the BPFs 3a-3d are set to correspond to a plurality of consecutive target wavelengths in the wavelength grid. In the example depicted in FIG. 3, the center wavelengths in the passbands of the BPFs 3a-3d are set to respectively match target wavelengths λga-λgd. The widths of the passbands of the BPFs 3a-3d are less than a wavelength spacing in the wavelength grid.

The temperature sensor 4 is provided in the vicinity of the light sources 1a-1d. Thus, the temperature sensor 4 detects the temperature of the area around the light sources 1a-1d.

The TEC 5 adjusts the temperature of the light sources 1a-1d. The TEC 5 can decrease the temperature of the area around the TEC 5 and can also increase the temperature of the area around the TEC 5. The light sources 1a-1d are implemented on the TEC 5. Hence, the TEC 5 can adjust the temperature of the area around the light sources 1a-1d. Note that the photodetectors 2a-2d, the BPFs 3a-3d, and the temperature sensor 4 may also be implemented on the TEC 5.

The optical combiner 20 combines rays of light generated by the light sources 1a-1d. In this example, the optical combiner 20 includes BPFs 21a-21d. As in the case of the BPFs 3a-3d, the center wavelengths in the passbands of the BPFs 21a-21d are configured to respectively match target wavelengths λga-λgd. However, the widths of the passbands of the BPFs 21a-21d may be greater than the widths of the passbands of the BPFs 3a-3d. Meanwhile, it is preferable that the widths of the passbands of the BPFs 21a-21d be also less than the wavelength spacing in the wavelength grid.

The controller 30 generates a control signal for controlling the TEC 5 according to output signals of the photodetectors 2a-2d. For example, when the photodetectors 2a-2d output monitor currents each indicating the power of corresponding monitor light, the controller 30 may generate a control signal based on the sum of the monitor currents. In this case, the sum of the monitor currents corresponds to the total power of rays of monitor light that arrive at the photodetectors 2a-2d. Thus, the controller 30 substantially generates a control signal for controlling the TEC 5 according to the total power of rays of monitor light that arrive at the photodetectors 2a-2d. The controller 30 may also generate a control signal for controlling the TEC 5 according to output signals of the photodetectors 2a-2d and a temperature detected by the temperature sensor 4.

For example, the controller 30 may be implemented by a microcomputer that includes a processor and a memory. In this case, the functions of the controller 30 are implemented by the processor executing a program stored in the memory. The controller 30 may also be implemented by a hardware circuit. In this case, the hardware circuit is designed to implement the functions of the controller 30.

The TEC driver 40 drives the TEC 5 in accordance with a control signal generated by the controller 30. Thus, the temperature of the TEC 5 is adjusted by the controller 30.

Figure 3:
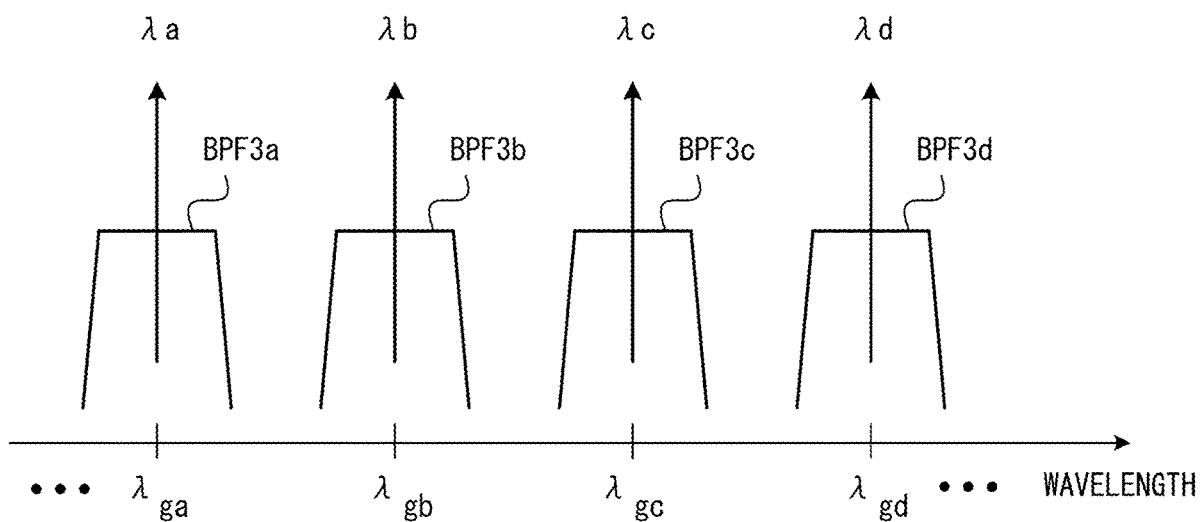
FIG. 3 illustrates an example of the wavelengths of light generated by light sources and the arrangement of the passbands of BPFs.

Next, operations of the light source device 100 are described. In this example, the light source device 100 has been designed such that, as depicted in FIG. 3, the wavelengths λa-λd of the light sources 1a-1d respectively match the target wavelengths λga-λgd in the wavelength grid and the center wavelengths in the passbands of the BPFs 3a-3d respectively match the target wavelengths λga-λgd. However, due to variations among the laser diodes that could be caused in a fabrication process, it will be difficult to respectively completely match the wavelengths λa-λd with the target wavelengths λga-λgd.

Figure 4A:
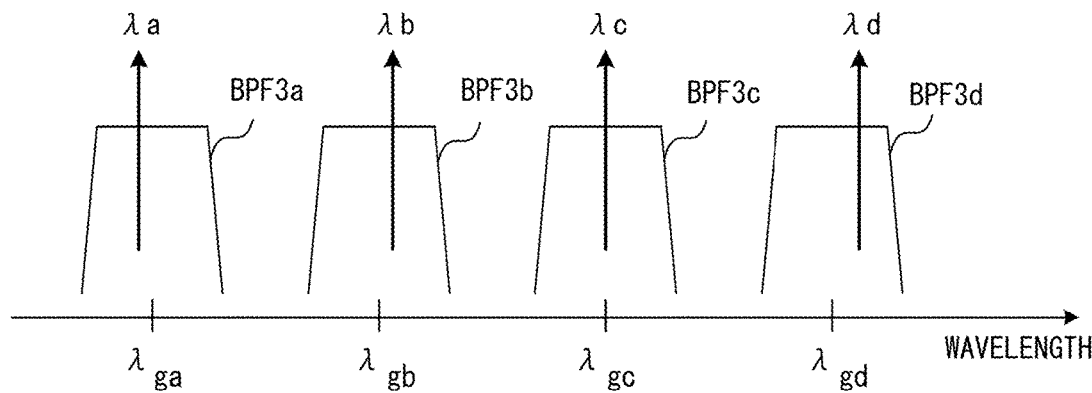
FIGS. 4A-4C illustrate examples of changes in the wavelengths of light generated by light sources with respect to temperature.

Accordingly, the following description is based on the assumption that the wavelengths λa-λd respectively have differences from the target wavelengths λga-λgd. In particular, as depicted in FIG. 4A, the wavelength λa is shifted toward a short-wavelength side with respect to the target wavelength λga. The wavelength λb is shifted toward a long-wavelength side with respect to the target wavelength λgb. The wavelength λc almost matches the target wavelength λgc. The wavelength λd is shifted toward the long-wavelength side with respect to the target wavelength λgd.

A ray of monitor light generated by the light source 1a may hereinafter be referred to as "monitor light λa". Similarly, rays of monitor light generated by the light sources 1b, 1c, and 1d may hereinafter be referred to as "monitor light λb", "monitor light λc", and "monitor light λd", respectively.

Figure 5:
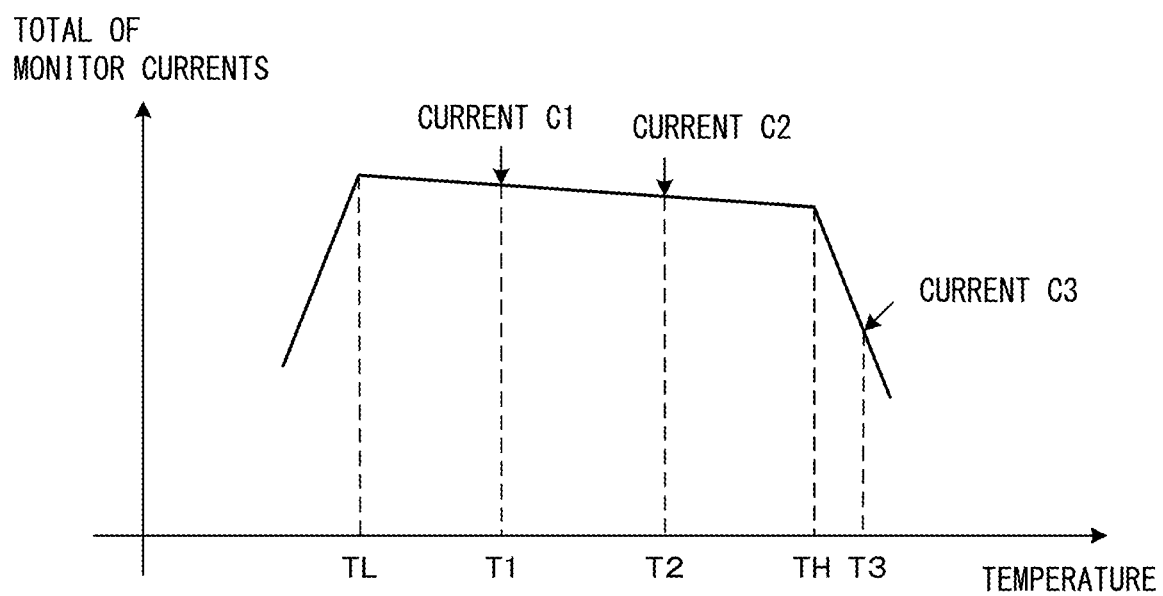
FIG. 5 illustrates an example of a relationship between the temperature of the area around light sources and the total of monitor currents.

When the light sources 1a-1d in the light source device 100 emit light, rays of monitor light λa-λd respectively pass through the BPFs 3a-3d and are guided to the photodetectors 2a-2d. The photodetectors 2a-2d respectively output monitor currents corresponding to the powers of the monitor light λa-λd. The controller 30 calculates the total of the monitor currents output from the photodetectors 2a-2d. In this example, when the temperature of the area around the light sources 1a-1d is T1, the total of the monitor currents is C1, as depicted in FIG. 5.

When the temperature of the area around the light sources 1a-1d changes, the wavelengths λa-λd of rays of light generated by the light sources 1a-1d also change. In this example, when the temperature of the area around the light sources 1a-1d increases, the wavelengths λa-λd shift toward the long-wavelength side. Variations in the center wavelengths in the passbands of the BPFs 3a-3d that are associated with a temperature change are sufficiently small in comparison with variations in the wavelengths λa-λd that are associated with the temperature change. Thus, in this example, variations in the center wavelengths in the passbands of the BPFs 3a-3d that are associated with a temperature change are not considered for ease of descriptions.

Figure 4B:
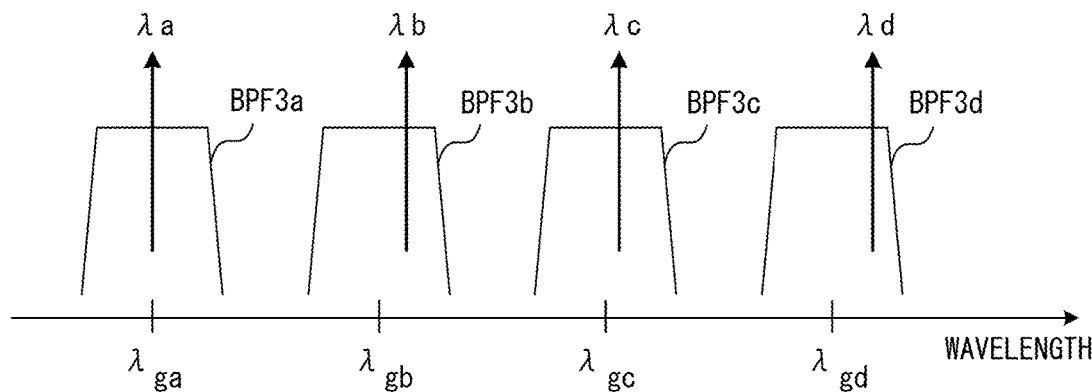

When the temperature of the area around the light sources 1a-1d increases from T1 to T2, the wavelengths λa-λd are shifted toward the long-wavelength side in comparison with the condition depicted in FIG. 4A. As a result, the condition depicted in FIG. 4B is attained. The controller 30 calculates the total of the monitor currents output from the photodetectors 2a-2d. In this example, when the temperature of the area around the light sources 1a-1d is T2, the total of the monitor currents is C2, as depicted in FIG. 5. In this case, the wavelengths λa-λd are respectively located in the passbands of the BPFs 3a-3d. Thus, the powers of the rays of monitor light λa-λd that arrive at the photodetectors 2a-2d do not significantly change between the case depicted in FIG. 4A and in the case depicted in FIG. 4B.

In this example, the output powers of the light sources 1a-1d slightly decrease when the temperature of the area around the light sources 1a-1d increases. Thus, in the example depicted in FIG. 5, the total of the monitor currents decreases from C1 to C2 when the temperature of the area around the light sources 1a-1d increases from T1 to T2.

Figure 4C:
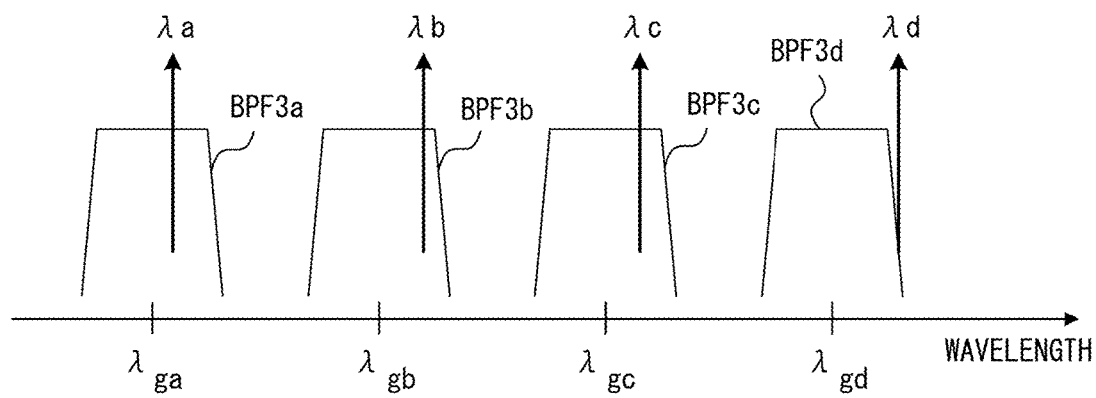

When the temperature of the area around the light sources 1a-1d increases from T2 to T3, the wavelengths λa-λd are further shifted toward the long-wavelength side in comparison with the condition depicted in FIG. 4B. As a result, the condition depicted in FIG. 4C is attained. The controller 30 calculates the total of the monitor currents output from the photodetectors 2a-2d. However, as depicted in FIG. 4C, the wavelength λd has been shifted to the outside of the passband of the BPF 3d. Hence, when the temperature of the area around the light sources 1a-1d is T3, the power of the monitor light λd that arrives at the photodetector 2d is remarkably decreased in comparison with the conditions depicted in FIGS. 4A and 4B. As a result, C3, i.e., the total of the monitor currents when the temperature of the area around the light sources 1a-1d is T3, is far smaller than C1 and C2, as depicted in FIG. 5.

As described above, the total of the monitor currents sharply decreases when the temperature of the area around the light sources 1a-1d increases and one or more of the wavelengths λa-λd are shifted to the outside of the passbands of corresponding BPFs of the BPFs 3a-3d. Assume that the center wavelengths in the passbands of the BPFs 3a-3d approximately match the corresponding target wavelengths λga-λgd on the wavelength grid. In this case, the controller 30 can decide that one or more of the wavelengths λa-λd have been largely shifted from corresponding target wavelengths of the target wavelengths λga-λgd by monitoring the total of the monitor currents.

In the examples depicted in FIGS. 4A-4C, the total of the monitor currents sharply decreases when the temperature of the area around the light sources 1a-1d increases. However, the total of the monitor currents could also sharply decrease when the temperature of the area around the light sources 1a-1d decreases. In particular, the total of the monitor currents sharply decreases when the temperature of the area around the light sources 1a-1d deviates from a specified temperature range. In FIG. 5, the specified temperature range is indicated by a lower limit temperature TL and an upper limit temperature TH. In this case, a variation in the total of the monitor currents is small when the temperature of the area around the light sources 1a-1d is higher than or equal to the lower limit temperature TL and less than or equal to the upper limit temperature TH. When the temperature of the area around the light sources 1a-1d decreases and goes below the lower limit temperature TL, the total of the monitor currents sharply decreases. When the temperature of the area around the light sources 1a-1d increases and goes above the upper limit temperature TH, the total of the monitor currents also sharply decreases.

However, by simply monitoring the total of the monitor currents, the controller 30 may be incapable of decide whether the temperature of the area around the light sources 1a-1d has gone below the lower limit temperature TL or has gone above the upper limit temperature TH.

Accordingly, the controller 30 refers to an output signal of the temperature sensor 4 that detects the temperature of the area around the light sources 1a-1d. When the total of the monitor currents sharply decreases while the temperature of the area around the light sources 1a-1d is increasing, the controller 30 decides that one or more of the wavelengths λa-λd have been largely shifted from corresponding target wavelengths of the target wavelengths λga-λgd because the temperature of the area around the light sources 1a-1d has gone above the upper limit temperature TH. When the total of the monitor currents sharply decreases while the temperature of the area around the light sources 1a-1d is decreasing, the controller 30 decides that one or more of the wavelengths λa-λd have been largely shifted from corresponding target wavelengths of the target wavelengths λga-λgd because the temperature of the area around the light sources 1a-1d has gone below the lower limit temperature TL.

The controller 30 controls the TEC 5 according to a result of the decision above. In particular, when deciding that one or more of the wavelengths λa-λd have been largely shifted from corresponding target wavelengths of the target wavelengths λga-λgd due to a temperature increase, the controller 30 generates a control signal for decreasing the temperature of the area around the light sources 1a-1d. When deciding that one or more of the wavelengths λa-λd have been largely shifted from corresponding target wavelengths of the target wavelengths λga-λgd due to a temperature decrease, the controller 30 generates a control signal for increasing the temperature of the area around the light sources 1a-1d.

The TEC driver 40 drives the TEC 5 in accordance with a control signal generated by the controller 30. In particular, the TEC 5 decreases the temperature of the area around the light sources 1a-1d when one or more of the wavelengths λa-λd have been largely shifted from corresponding target wavelengths of the target wavelengths λga-λgd due to a temperature increase. As a result, the shift of the wavelengths λa-λd from the target wavelengths λga-λgd is suppressed. Meanwhile, the TEC 5 increases the temperature of the area around the light sources 1a-1d when one or more of the wavelengths λa-λd have been largely shifted from corresponding target wavelengths of the target wavelengths λga-λgd due to a temperature decrease. Also in this case, the shift of the wavelengths λa-λd from the target wavelengths λga-λgd is suppressed.

By contrast, when the total of the monitor currents slowly changes, the controller 30 decides that the wavelengths λa-λd are respectively located in the passbands of the corresponding BPFs 3a-3d. Thus, when the total of the monitor currents slowly changes, the controller 30 decides that the wavelengths λa-λd are respectively located in the vicinities of the corresponding target wavelengths λga-λgd. In this case, the temperature of the area around the light sources 1a-1d does not need to be changed. Accordingly, when the total of the monitor currents slowly changes, the controller 30 generates a control signal for maintaining the TEC 5 in an off state. In response to this, the TEC driver 40 stops driving the TEC 5.

As described above, the wavelengths λa-λd are adjusted by controlling the TEC 5 when one or more of the wavelengths λa-λd have been largely shifted from corresponding target wavelengths λga-λgd. Meanwhile, the TEC 5 stops operations when the wavelengths λa-λd are respectively located in the vicinities of the corresponding target wavelengths λga-λgd. Thus, the light source device that includes the plurality of light sources can realize accurate wavelength control while reducing power consumption.

FIG. 6 is a flowchart illustrating an example of wavelength control performed by the controller 30. For example, the processes of this flowchart may be periodically performed by the controller 30. In this case, for example, the processes of the flowchart may be performed at, but not particularly limited to, an interval of one minute. The controller 30 also holds a temperature T(i−1) and the total value C(i−1) of monitor currents, both obtained in a previous process, in a memory (not illustrated).

In S1, the controller 30 detects the temperature T(i) of the area around the light sources 1*a*-1*d* by acquiring an output signal of the temperature sensor 4. In S2, the controller 30 calculates the total C(i) of the monitor currents by acquiring output signals of the photodetectors 2*a*-2*d*. The total C(i) of the monitor currents corresponds to the total optical power of rays of monitor light λa-λd that have arrived at the photodetectors 2*a*-2*d* after passing through the BPFs 3*a*-3*d*. In S3, the controller 30 calculates the amount of decrease in the total of the monitor currents, i.e., a decrease amount ΔC. The decrease amount ΔC corresponds to the difference between the total value C(i−1) stored in the memory and the newly calculated total C(i).

In S4, the controller 30 compares the decrease amount ΔC of the total of the monitor currents with a specified threshold. This threshold is determined in advance through measurement or a simulation. For example, the threshold may be determined according to the difference between the total of the monitor currents obtained when the wavelengths λa-λd are respectively located in the passbands of the BPFs 3*a*-3*d* and the total of the monitor currents obtained when one of the wavelengths λa-λd has been shifted to the outside of the passband of a corresponding BPF of the BPFs 3*a*-3*d*.

When the decrease amount ΔC is less than the threshold, the controller 30 decides that the wavelengths λa-λd are respectively located in the passbands of the BPFs 3*a*-3*d*. In this case, the controller 30 generates a control signal for stopping the TEC 5 in S5. Thus, the TEC 5 stops operations since the TEC driver 40 does not drive the TEC 5.

When the decrease amount ΔC is greater than or equal to the threshold, the controller 30 decides that one or more of the wavelengths λa-λd have been shifted to the outsides of the passbands of corresponding BPFs of the BPFs 3*a*-3*d*. In this case, the controller 30 decides in S6 whether the temperature of the area around the light sources 1*a*-1*d* is increasing or decreasing. In particular, when the newly detected temperature T(i) is higher than the temperature T(i−1) stored in the memory, it is decided that the temperature of the area around the light sources 1*a*-1*d* is increasing. When the temperature T(i) is lower than the temperature T(i−1), it is decided that the temperature of the area around the light sources 1*a*-1*d* is decreasing.

When the decrease amount ΔC is greater than or equal to the threshold and the temperature of the area around the light sources 1*a*-1*d* is increasing, the controller 30 generates, in S7, a control signal for decreasing the temperature of the area around the light sources 1*a*-1*d*. In response to this, the TEC driver 40 drives the TEC 5 so as to decrease the temperature of the area around the light sources 1*a*-1*d*. When the decrease amount ΔC is greater than the threshold and the temperature of the area around the light sources 1*a*-1*d* is decreasing, the controller 30 generates, in S8, a control signal for increasing the temperature of the area around the light sources 1*a*-1*d*. In response to this, the TEC driver 40 drives the TEC 5 so as to increase the temperature of the area around the light sources 1*a*-1*d*.

In the example depicted in FIG. 6, when the decrease amount ΔC is greater than or equal to the threshold, the controller 30 determines the direction for temperature adjustment in accordance with whether the temperature of the area around the light sources 1*a*-1*d* is increasing or decreasing. However, the invention is not limited to this method. For example, the controller 30 may determine the direction for temperature adjustment in accordance with whether the temperature of the area around the light sources 1*a*-1*d* is higher than a specified threshold temperature (or a specified threshold temperature range). In particular, when the decrease amount ΔC is greater than or equal to the threshold and the temperature of the area around the light sources 1*a*-1*d* is higher than the threshold temperature, the controller 30 may control the TEC 5 so as to decrease the temperature of the area around the light sources 1*a*-1*d*. When the decrease amount ΔC is greater than or equal to the threshold and the temperature of the area around the light sources 1*a*-1*d* is lower than the threshold temperature, the controller 30 may control the TEC 5 so as to increase the temperature of the area around the light sources 1*a*-1*d*. This method is implemented by comparing the temperature of the area around the light sources 1*a*-1*d* with the threshold temperature, instead of performing the process of S6 depicted in FIG. 6. The specified threshold temperature is not particularly limited and may be, for example, an ordinary temperature (i.e., 20° C.).

When a threshold temperature range is used instead of the threshold temperature, the controller 30 may control the TEC 5 so as to decrease the temperature of the area around the light sources 1*a*-1*d* when the decrease amount ΔC is greater than or equal to the threshold and the temperature of the area around the light sources 1*a*-1*d* is higher than the upper limit of the threshold temperature range. When the decrease amount ΔC is greater than or equal to the threshold and the temperature of the area around the light sources 1*a*-1*d* is lower than the lower limit of the threshold temperature range, the controller 30 may control the TEC 5 so as to increase the temperature of the area around the light sources 1*a*-1*d*.

FIG. 7 is a flowchart illustrating another example of wavelength control performed by the controller 30. For example, the processes of this flowchart may be periodically performed by the controller 30. In this case, for example, the processes of the flowchart may be performed at, but not particularly limited to, an interval of one minute. The controller 30 also holds a reference value C0 for the total of monitor currents in a memory (not illustrated). The reference value C0 indicates the total value of the monitor currents obtained when all of the wavelengths λa-λd are located in the passbands of the corresponding BPFs 3*a*-3*d*. Note that this method is preferable when the output powers of the light sources 1*a*-1*d* are kept at specified target values.

The processes of S1-S2 depicted in the flowchart in FIG. 6 and those in FIG. 7 are substantially the same. Thus, the controller 30 detects the temperature of the area around the light sources 1*a*-1*d* and calculates the total of the monitor currents. Note that the total value calculated in S2 may hereinafter be referred to as "C1".

In S11, the controller 30 obtains the reference value C0 for the total of the monitor currents from a memory. In S12, the controller 30 calculates the proportion of the total value C1 to the reference value C0 (i.e., C1/C0). Then, the controller 30 compares this proportion with a specified threshold. For example, the threshold may be determined such that it can be sensed when the wavelength of one of the light sources 1a-1d has been shifted to the outside of the passband of a corresponding BPF. Thus, the threshold is set to, for example, about 0.8-0.9 when the light source device 100 includes four light sources 1a-1d.

When the proportion is greater than the threshold, the controller 30 decides that all of the wavelengths λa-λd are located in the passbands of the corresponding BPFs. In this case, the controller 30 generates a control signal for stopping the TEC 5 in S5. Thus, the TEC 5 stops operations since the TEC driver 40 does not drive the TEC 5.

When the proportion is less than or equal to the threshold, the controller 30 decides that at least one of the wavelengths λa-λd has been shifted to the outside of the passband of a corresponding BPF. In this case, the controller 30 compares the temperature of the area around the light sources 1a-1d with the threshold temperature. When it is found that the temperature of the area around the light sources 1a-1d is higher than the threshold temperature, the controller 30 generates, in S7, a control signal for decreasing the temperature of the area around the light sources 1a-1d. In response to this, the TEC driver 40 drives the TEC 5 so as to decrease the temperature of the area around the light sources 1a-1d. When the temperature of the area around the light sources 1a-1d is lower than the threshold temperature, the controller 30 generates, in S8, a control signal for increasing the temperature of the area around the light sources 1a-1d. In response to this, the TEC driver 40 drives the TEC 5 so as to increase the temperature of the area around the light sources 1a-1d.

FIGS. 8A-8D illustrate variations of the arrangements of the wavelengths of the light sources 1a-1d with respect to the passbands of the BPFs 3a-3d. In the example depicted in FIG. 8A, both light sources that generate light with wavelengths shorter than the center wavelengths in the passbands of corresponding BPFs and light sources that generate light with wavelengths longer than the center wavelengths in the passbands of corresponding BPFs are seen in an initial state (e.g., a state in which the temperature of the area around the light sources 1a-1d is an ordinary temperature). In particular, the wavelength λa of the light source 1a is shorter than the center wavelength in the passband of the BPF 3a, and the wavelength λd of the light source 1d is longer than the center wavelength in the passband of the BPF 3d. In this case, when the temperature decreases even only a little, the wavelength λa will be shifted to the outside of the passband of the BPF 3a, thereby sharply decreasing the total of the monitor currents. Similarly, when the temperature increases even only a little, the wavelength λd will be shifted to the outside of the passband of the BPF 3d, thereby sharply decreasing the total of the monitor currents. Thus, the temperature range in which the TEC 5 is stopped is narrowed, and the reduction in power consumption of the light source device 100 could be insufficient.

Figure 8A:
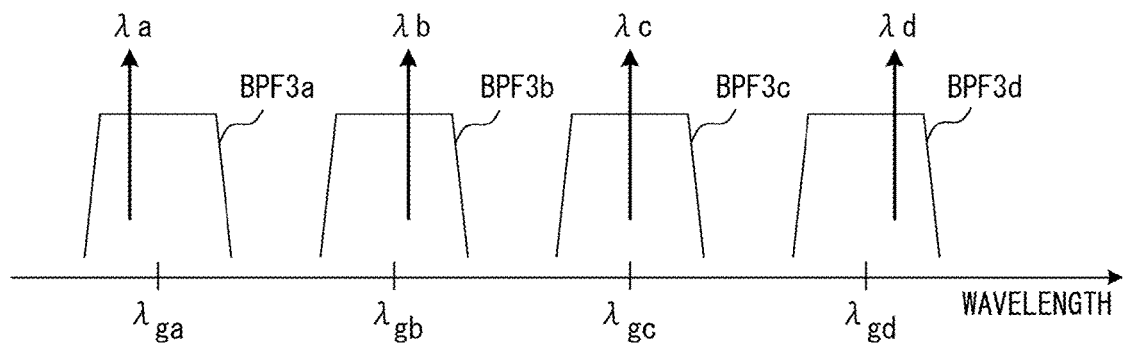
FIGS. 8A-8D illustrate variations of the arrangements of the wavelengths of light sources with respect to the passbands of BPFs.
Figure 8B:
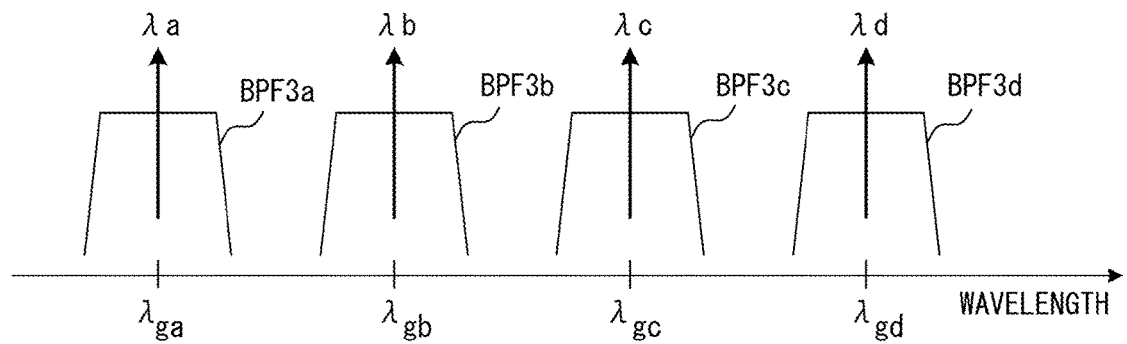

In the example depicted in FIG. 8B, all of the wavelengths λa-λd match, or substantially match, the center wavelengths in the passbands of the corresponding BPFs 3a-3d, respectively. In this situation, the margin before the wavelength of any of the light sources is shifted to the outside of the passband of the corresponding BPF is larger than in the case depicted in FIG. 8A. Thus, the temperature range in which the TEC 5 is stopped is wide, and the power consumption of the light source device 100 is reduced.

Figure 8C:
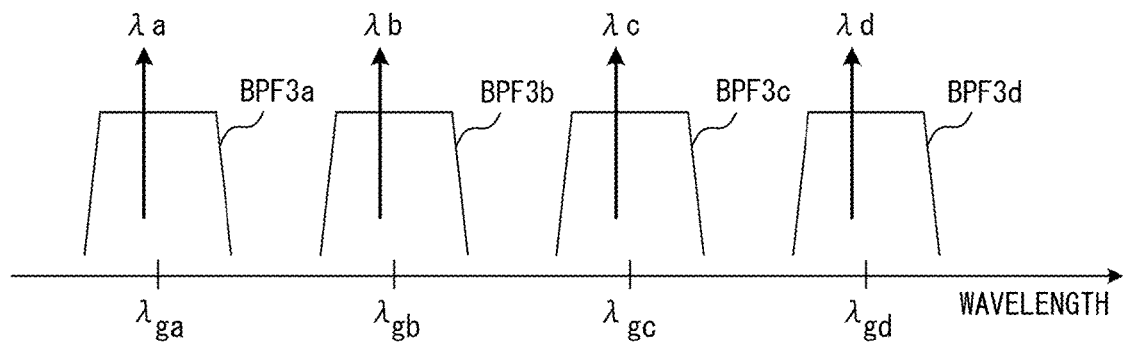

In the example depicted in FIG. 8C, all of the wavelengths λa-λd are respectively shorter than the center wavelengths in the passbands of the corresponding BPFs 3a-3d. With this arrangement, the effect of reducing the power consumption is increased in, for example, a usage pattern in which while the light source device 100 is in operation, the wavelengths λa-λb tend to be longer than in the initial state.

Figure 8D:
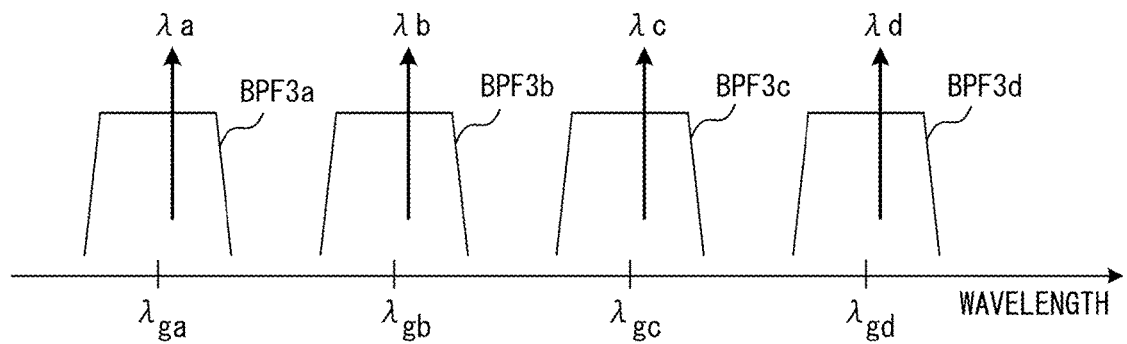

In the example depicted in FIG. 8D, all of the wavelengths λa-λd are respectively longer than the center wavelengths in the passbands of the corresponding BPFs 3a-3d. With this arrangement, the effect of reducing the power consumption is increased in, for example, a usage pattern in which while the light source device 100 is in operation, the wavelengths λa-λb tend to be shorter than in the initial state.

Widening the passbands of the BPFs 3a-3d makes the wavelengths λa-λd less likely to be shifted to the outside of the passbands of the corresponding BPFs 3a-3d and thus makes the monitor currents unlikely to be sharply decreased. As a result, the TEC 5 is stopped for a long time, and the effect of reducing the power consumption is increased. However, when the passbands of the BPFs 3a-3d are wide, the wavelengths λa-λd could have large differences from target wavelengths. Hence, the widths of the passbands of the BPFs 3a-3d are preferably configured appropriately in consideration of both reduction in the power consumption and the allowable differences for the wavelengths λa-λd respectively from the target wavelengths.

Figure 9:
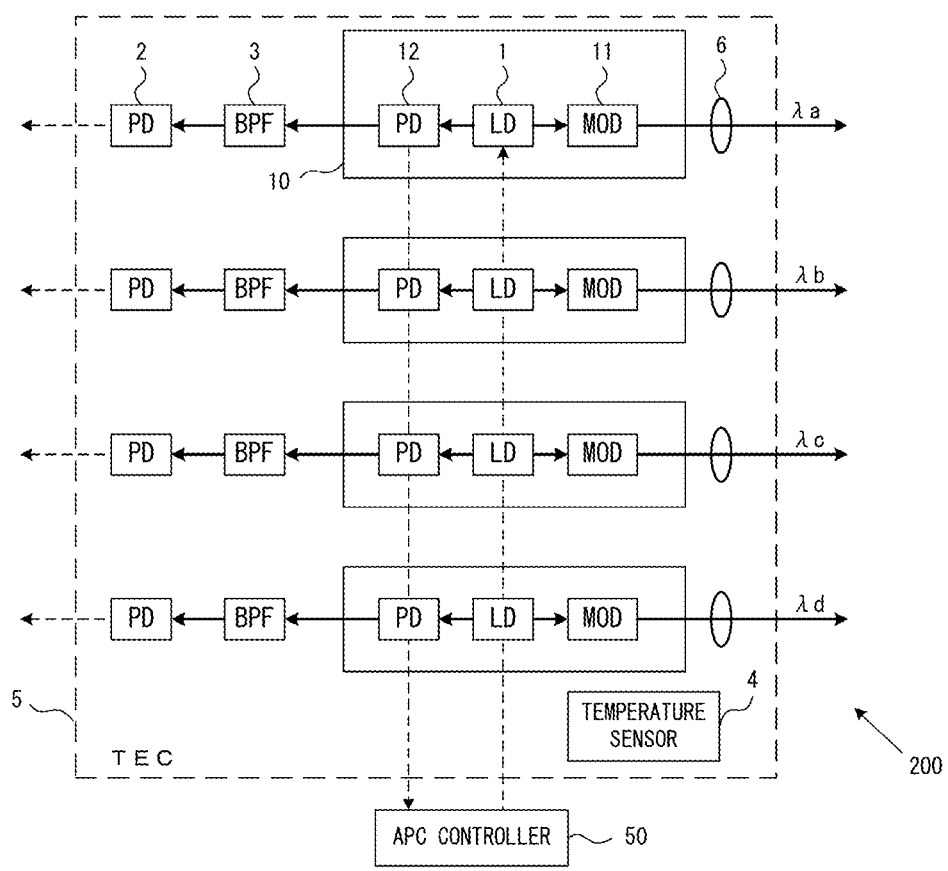
FIG. 9 illustrates a variation of a light source device in accordance with embodiments of the invention.

FIG. 9 illustrates a variation of a light source device in accordance with embodiments of the invention. In this example, a light source device 200 includes an auto-power-control (APC) controller 50 to keep the output powers of light sources 1a-1d at specified target values. Note that the optical combiner 20, the controller 30, and the TEC driver 40 depicted in FIG. 2 are omitted in FIG. 9.

The light source device 200 is provided with, for each of wavelengths λa-λd, an optical integrated circuit 10, a photodetector 2, a BPF 3, and a lens 6. The optical integrated circuit 10 includes a light source 1, an optical modulator (MOD) 11, and a photodetector 12. In this example, the optical integrated circuit 10 is implemented by an electro-absorption modulator integrated laser (EML).

The light source 1 outputs light with a designated wavelength. The light source 1 outputs main light forward and outputs monitor light rearward. The optical modulator 11 generates a modulated optical signal by modulating main light output from the light source 1. The optical modulator 11 is supplied with a drive signal. The modulated optical signal generated by the optical modulator 11 is guided to the optical combiner via the lens 6.

The photodetector 12 detects the output power of the light source 1 by detecting an evanescent component in monitor light guided from the light source 1 to the BPF 3. The photodetector 2 detects monitor light passing through the BPF 3. The controller generates a control signal for controlling the TEC 5 by using output signals of the photodetectors 2, as in the configuration depicted in FIG. 2.

The APC controller 50 controls the output power of the light source 1 by using an output signal of the photodetector 12. In particular, the APC controller 50 controls the output power of the light source 1 so as to bring a current output from the photodetector 12 close to a target value. As a result, the output power of the light source 1 is kept at a target level. That is, APC is implemented.

FIG. 10 illustrates another variation of a light source device in accordance with embodiments of the invention. In this example, a light source device 300 includes an APC controller 50 to keep the output powers of light sources 1a-1d at specified target values, as with the light source device 200 depicted in FIG. 9. Note that the optical combiner 20, the controller 30, and the TEC driver 40 depicted in FIG. 2 are omitted in FIG. 10.

The light source device 300 is provided with, for each of wavelengths λa-λd, an optical integrated circuit 10x, a photodetector 2, a BPF 3, a lens 6, an optical filter 7, and a photodetector 8. The optical integrated circuit 10x includes a light source 1 and an optical modulator (MOD) 11. The light sources 1 and the optical modulators 11 in FIG. 10 are substantially the same as those in FIG. 9, and descriptions of these components are omitted herein.

The optical filter 7 passes and guides monitor light output from the light source 1 to the BPF 3 and reflects and guides a portion of the monitor light to the photodetector 8. The photodetector 8 detects the output power of the light source 1 by detecting the monitor light reflected from the optical filter 7. The photodetector 2 detects monitor light passing through the optical filter 7 and the BPF 3. The controller generates a control signal for controlling the TEC 5 by using output signals of the photodetectors 2, as in the configuration depicted in FIG. 2.

The operations of the APC controller 50 in FIGS. 9 and 10 are substantially the same. Thus, the APC controller 50 controls the output power of the light source 1 by using an output signal of the photodetector 8. In particular, the APC controller 50 controls the output power of the light source 1 so as to bring a current output from the photodetector 8 close to a target value. As a result, the output power of the light source 1 is kept at a target level. That is, APC is implemented.

In the configurations depicted in FIGS. 9 and 10, APC is performed using monitor light for wavelength control, and the output powers of the light sources 1 are kept at specified target levels. Thus, wavelength control and power control are implemented efficiently. Since the output powers of the light sources 1 are kept at specified target levels, the processes in the flowchart depicted in FIG. 7 are easily implemented.

As described above, in the light source device in accordance with embodiments of the present invention, the TEC for adjusting the temperature of the area around the light sources 1a-1d is operated only when the wavelength of light generated by any of the light sources 1a-1d is shifted from a target wavelength. Therefore, power consumption of the light source device can be reduced while performing wavelength control for WDM with small wavelength spacings.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A light source device comprising:
    a plurality of light sources that generate rays of light with different wavelengths corresponding to a plurality of target wavelengths located on a designated wavelength grid;
    a plurality of photodetectors that detect output powers of the plurality of light sources and generate currents indicating the output powers of the plurality of light sources as output signals, respectively;
    a plurality of optical bandpass filters that are provided between the plurality of light sources and the plurality of photodetectors;
    a temperature adjustment unit that adjusts a temperature of an area around the plurality of light sources; and
    a processor that calculates a total of the currents generated by the plurality of photodetectors and controls the temperature adjustment unit based on the total of the currents generated by the plurality of photodetectors,
    wherein widths of passbands of the optical bandpass filters are less than a wavelength spacing in the wavelength grid.

2. The light source device according to claim 1, wherein the processor
    periodically calculates the total of the currents, and
    stops operations of the temperature adjustment unit when an amount of decrease in the total of the currents is less than a specified threshold.

3. The light source device according to claim 2,
    further comprising: a temperature sensor that detects the temperature of the area around the plurality of light sources,
    wherein the processor
        drives the temperature adjustment unit so as to decrease the temperature of the area around the plurality of light sources when the amount of decrease in the total of the currents is greater than or equal to the threshold and the temperature of the area around the plurality of light sources increases, and
        drives the temperature adjustment unit so as to increase the temperature of the area around the plurality of light sources when the amount of decrease in the total of the currents is greater than or equal to the threshold and the temperature of the area around the plurality of light sources decreases.

4. The light source device according to claim 2,
    further comprising: a temperature sensor that detects the temperature of the area around the plurality of light sources,
    wherein the processor
        drives the temperature adjustment unit so as to decrease the temperature of the area around the plurality of light sources when the amount of decrease in the total of the currents is greater than or equal to the threshold and the temperature of the area around the plurality of light sources is higher than a specified threshold temperature, and
        drives the temperature adjustment unit so as to increase the temperature of the area around the plurality of light sources when the amount of decrease in the total of the currents is greater than or equal to the threshold and the temperature of the area around the plurality of light sources is lower than the threshold temperature.

5. The light source device according to claim 1, wherein the processor stops operations of the temperature adjustment unit when a proportion of the total of the currents to a reference value determined in advance is greater than a specified value.

6. The light source device according to claim 1, wherein a wavelength of the light generated by each of the light sources matches a center wavelength in the passband of a corresponding optical bandpass filter.

7. The light source device according to claim 1, wherein a wavelength of the light generated by each of the light sources is shorter than a center wavelength in the passband of a corresponding optical bandpass filter.

8. The light source device according to claim 1, wherein a wavelength of the light generated by each of the light sources is longer than a center wavelength in the passband of a corresponding optical bandpass filter.

9. The light source device according to claim 1, further comprising: a power controller that adjusts the output powers of the plurality of light sources to specified target levels by using rays of light guided from the plurality of light sources to the plurality of photodetectors.

10. A wavelength adjustment method that is performed by a light source device including a plurality of light sources that generate rays of light with different wavelengths corresponding to a plurality of target wavelengths located on a designated wavelength grid, a plurality of photodetectors that detect output powers of the plurality of light sources, a plurality of optical bandpass filters that are provided between the plurality of light sources and the plurality of photodetectors, and a temperature adjustment unit that adjusts a temperature of an area around the plurality of light sources, the wavelength adjustment method being a method of controlling the wavelengths of the rays of light generated by the plurality of light sources, wherein widths of passbands of the optical bandpass filters are less than a wavelength spacing in the wavelength grid, and an output signal of each of the photodetectors is a current indicating an output power of a corresponding light source, the wavelength adjustment method comprising:
  periodically calculating a total of currents generated by the plurality of photodetectors;
  stopping operations of the temperature adjustment unit when an amount of decrease in the total of the currents is less than a specified threshold;
  driving the temperature adjustment unit so as to decrease the temperature of the area around the plurality of light sources when the amount of decrease in the total of the currents is greater than or equal to the threshold and the temperature of the area around the plurality of light sources increases; and
  driving the temperature adjustment unit so as to increase the temperature of the area around the plurality of light sources when the amount of decrease in the total of the currents is greater than or equal to the threshold and the temperature of the area around the plurality of light sources decreases.

* * * * *